(12) United States Patent
Webster et al.

(10) Patent No.: US 6,448,920 B1
(45) Date of Patent: Sep. 10, 2002

(54) SYSTEM AND METHOD FOR CONVERTING ANALOG VALUES TO AND FROM REAL WORLD VALUES

(75) Inventors: Steven Webster, Raymond; Richard H. Breinlinger, Hampstead, both of NH (US)

(73) Assignee: Schneider Automation, Inc., North Andover, MA (US)

( * ) Notice: Subject to any disclaimer, the term of this patent is extended or adjusted under 35 U.S.C. 154(b) by 0 days.

(21) Appl. No.: 09/573,098

(22) Filed: May 17, 2000

(51) Int. Cl.[7] .............................................. H03M 1/12
(52) U.S. Cl. ....................................... 341/155; 341/118
(58) Field of Search ................................ 341/118, 120, 341/155; 340/347

(56) References Cited

U.S. PATENT DOCUMENTS

| | | | | |
|---|---|---|---|---|
| 4,345,241 A | * | 8/1982 | Takeuchi et al. ............ | 340/347 |
| 4,764,748 A | * | 8/1988 | Geen et al. ................. | 340/347 |
| 5,053,770 A | * | 10/1991 | Mayer et al. ............... | 341/118 |
| 5,995,033 A | * | 11/1999 | Roeckner et al. ........... | 341/155 |

* cited by examiner

*Primary Examiner*—Michael Tokar
*Assistant Examiner*—Joseph Lauture
(74) *Attorney, Agent, or Firm*—Michael J. Femal; Larry I. Golden

(57) ABSTRACT

A first system is provided having a plurality of analog input signals for a plurality of analog input devices. Each analog input signal has an analog input signal value. The first system converts each analog input signal value to an ultimate digital input value. The first system has an input converter for converting each analog input signal to a digital input signal having a digital input value. The digital input value directly corresponds to the analog input signal value. The first system also has a conveying means for conveying the analog input signal value as an ultimate digital input value without performing any additional conversion. A second system is also provided having a plurality of analog output signals for a plurality of analog output devices. Each analog output signal has an analog output signal value, and each analog output signal value is converted from an initial digital output signal value. The second system has a receiving and conveying means for receiving the initial digital output signal value, and for conveying the initial digital output signal value as a conveyed digital output signal value, without performing any conversion. The second system also has an output converter for converting the conveyed digital output signal value into the analog output signal value. The analog output signal value directly corresponds to the conveyed digital output signal value.

25 Claims, 4 Drawing Sheets

SYSTEM AND METHOD FOR CONVERTING ANALOG VALUES TO AND FROM REAL WORLD VALUES

TECHNICAL FIELD

The present invention relates to the conversion of analog values to real world values, and vice versa. More particularly, the present invention relates to a system and method for directly converting analog current and voltage values to and from real world values, as used within a control system.

BACKGROUND OF THE INVENTION

Analog input devices and output devices within an automation or other control system typically use 4–20 mA signals as their output and input, respectively. These signals must be converted into/from (depending on whether the device is an input or output device) a digital signal as used by controllers, typically programmable logic controllers (PLCs) and other digital devices. For an input signal, in addition to the conversion from an analog signal (i.e., 4–20 mA) to a digital signal, the signals must also be converted to a real world values so that the device in question has some meaningful representation of what is actually happening within the control environment, such as degrees Likewise, when meaningful representations are used within controllers or other digital devices, these representations must be converted to an analog signal which can be used by the output device.

In the context of input devices and the signals therefrom, with reference to FIG. 1, one prior system included a multi-channel (multiple signals) input multiplexor 2. In this case, one to N channels of 4–20 mA signals, where N was less than or equal to eight, are shown as input signals 10, 12, 14 to an input multiplexor 2. The input multiplexor 2 sends a 1–5 volt signal (input mux output signal 20) to an analog to digital (A-D) converter 4, which is capable of converting 0–5 volt signals to a digital output value of 0–32,000 (A-D output signal). Thus, since the input signal 20 to the A-D converter 4 is only a 1–5 volt value, the digital output values 22 will only be in the range from 6400–32000. However, to comply with accepted industrial standards, the ultimate digital output value 24 needed would be a number between 0–32000 decimal. Thus, the system also included a microprocessor 6, which would include conversion software code 8 running thereon to mathematically convert the A-D converter output value 22 of 6400–32000 to an ultimate output value 24 of 0–32000, and vice versa in the context of output devices. An analog input signal 10, 12, 14 of 4 mA would thus become an ultimate output value 24 of 0. An analog input signal 10, 12, 14 of 12 mA would become an ultimate output value 24 of 16000. Likewise, an analog input signal 10, 12, 14 of 16 mA would become an ultimate output value 24 of 24000, and an analog input signal 10, 12, 14 of 20 mA would become an ultimate output value 24 of 32000.

Digital values converted by the conversion software code 8 are in sixteen bit format. Since the conversion code makes use of multiply operations, the conversion process is long when using low cost eight or sixteen bit microprocessors. In this type of prior system, the input channels 10, 12, 14 would be read in sequential order (channel 1, 2, 3, . . . , N, where N is less than or equal to 8), then repeat. There is a requirement that the conversion code 8 running in the microprocessor 6 take no more time to perform the conversion calculations than it takes to obtain the next reading for the next channel, 10, 12, 14 from the A-D converter 4.

Hence, for a low-cost systems, there is a limitation with the process time of the conversion code 8 in conjunction with the microprocessor 6. In addition, the ultimate output values 24 are difficult for a process engineer to read and interpret since this value is not in an easily understandable format (i.e., an analog input signal 10, 12, 14 of 12 mA would become an ultimate output value 24 of 16000, instead of say 12000). These limitations of the above system shown in FIG. 1 used for input devices, is also true of the prior system for output devices shown in FIG. 2. The prior system shown in FIG. 2 works in the same fashion as the system shown in FIG. 1, only reversed.

The present invention is provided to solve these and other problems.

SUMMARY OF THE INVENTION

A first system is provided having a plurality of analog input signals for a plurality of analog input devices. Each analog input signal has an analog input signal value. The first system converts each analog input signal value to an ultimate digital input value. The first system has an input converter for converting each analog input signal to a digital input signal having a digital input value. The digital input value directly corresponds to the analog input signal value. The first system also has a conveying means for conveying the analog input signal value as an ultimate digital input value without performing any additional conversion.

A second system is also provided having a plurality of analog output signals for a plurality of analog output devices. Each analog output signal has an analog output signal value, and each analog output signal value is converted from an initial digital output signal value. The second system has a receiving and conveying means for receiving the initial digital output signal value, and for conveying the initial digital output signal value as a conveyed digital output signal value, without performing any conversion. The second system also has an output converter for converting the conveyed digital output signal value into the analog output signal value. The analog output signal value directly corresponds to the conveyed digital output signal value.

DETAILED DESCRIPTION

Figure 1:
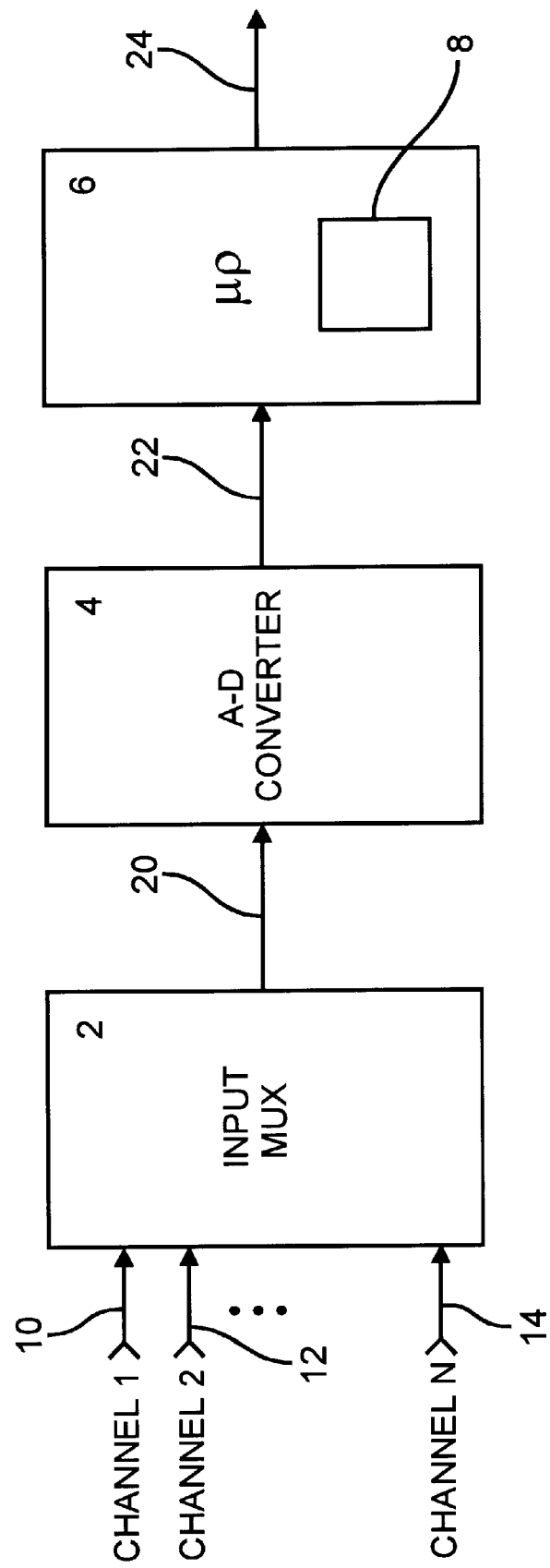
FIG. 1 is a block diagram of a prior input conversion system.
Figure 2:
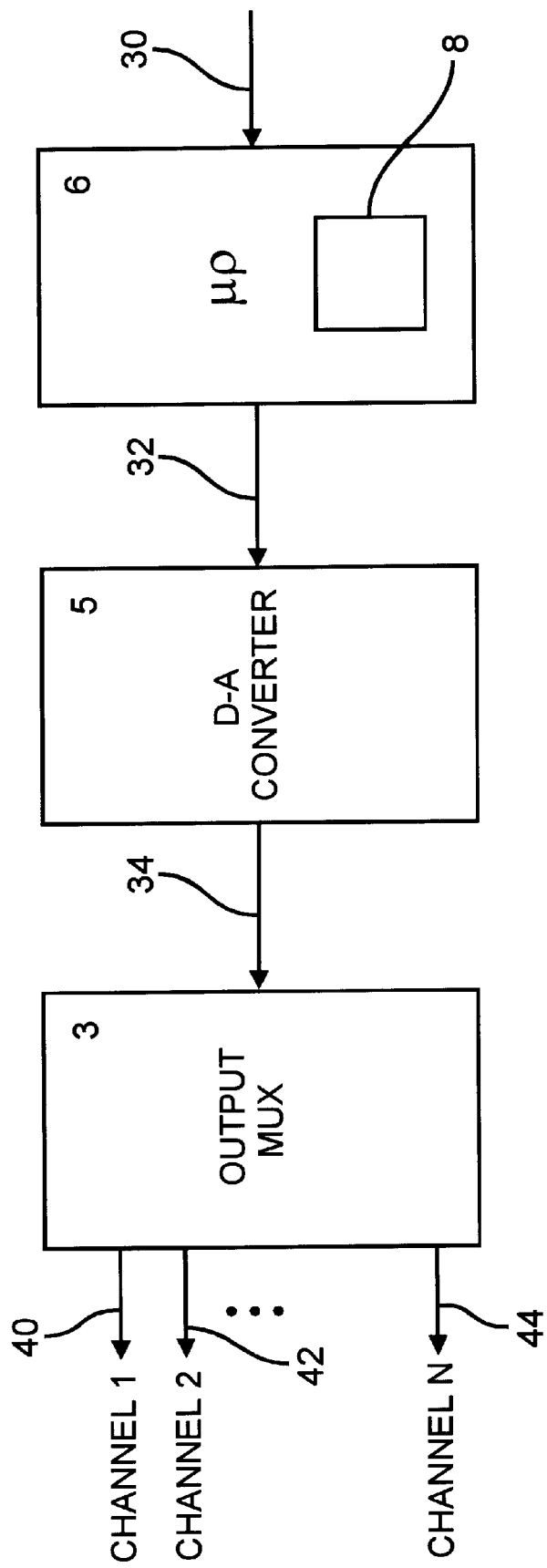
FIG. 2 is a block diagram of a prior output conversion system.

While this invention is susceptible of embodiment in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

Figure 3:
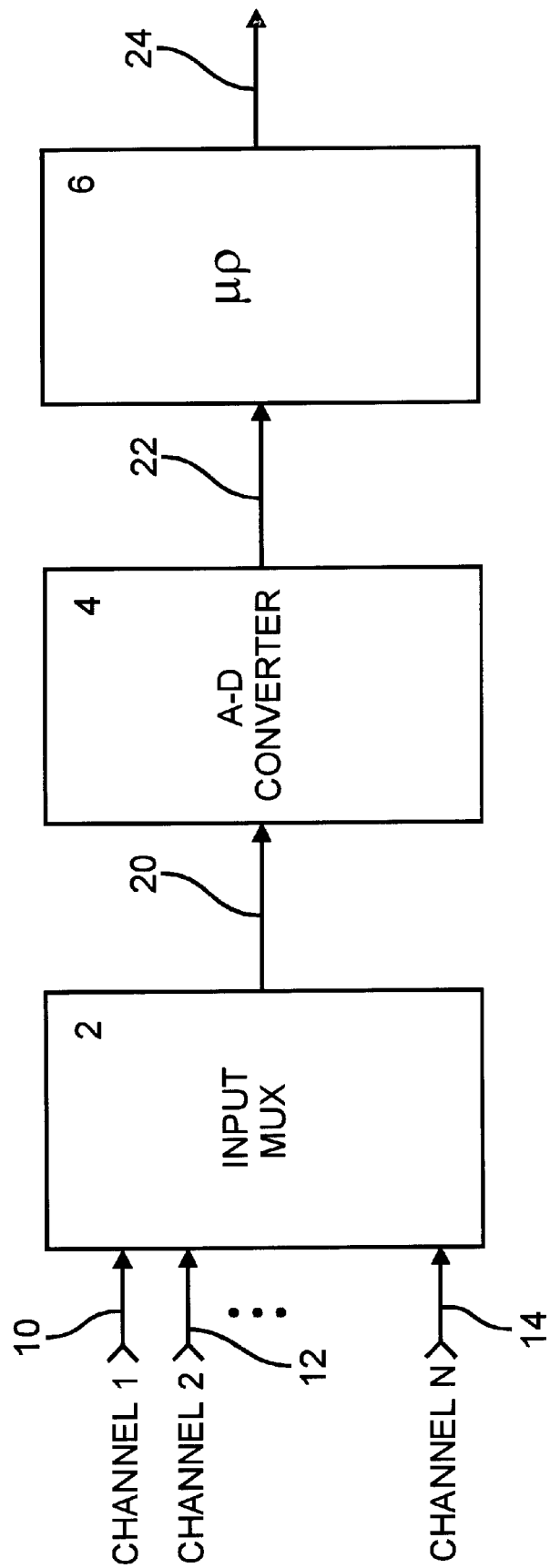
FIG. 3 is a block diagram of an input conversion system of the present invention.
Figure 4:
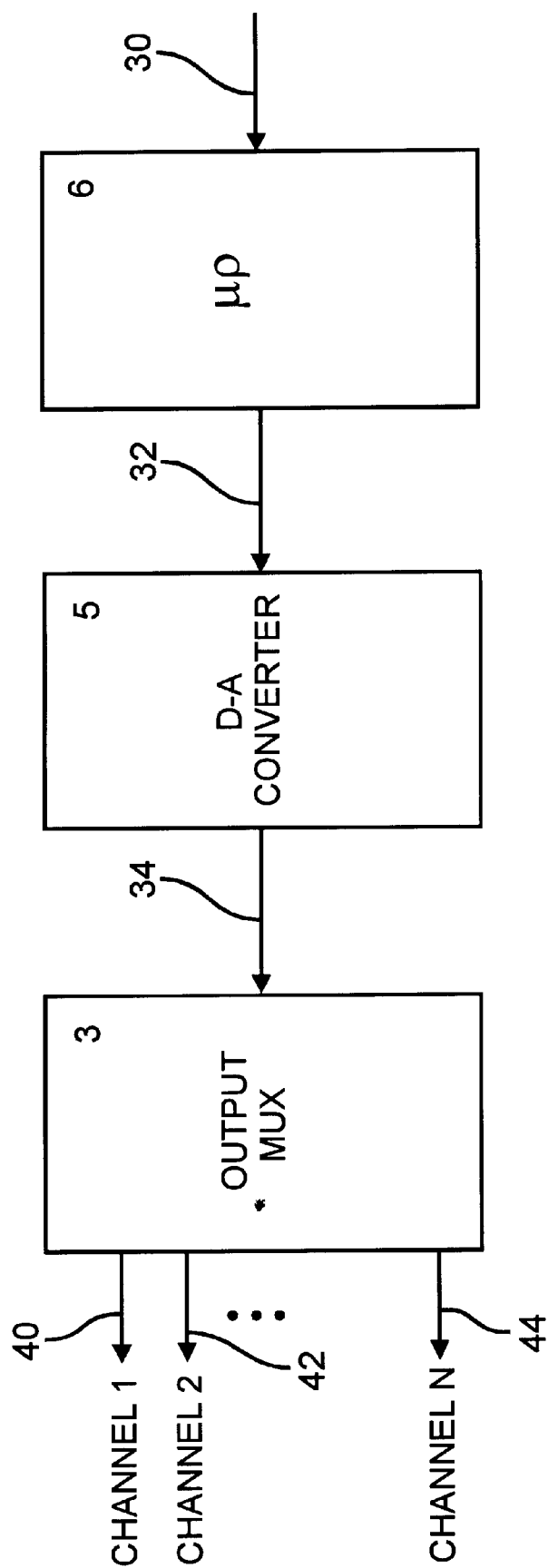
FIG. 4 is a block diagram of an output conversion system of the present invention.

A traditional analog module in an automation environment operates on a relative value between the real world and the programmable logic controller (PLC). This present invention does the conversion to an actual voltage or current values within the analog module. The present invention can take several different general forms. The first form is a system which is depicted in FIG. 3 as a analog input system used for analog input devices. The second form is a system which is depicted in FIG. 4 as a analog output system used for analog output devices.

With reference to FIG. 3, a first system is provided having a plurality of analog input signals 10, 12, 14 for a plurality of analog input devices (not shown). These signals are shown as channels (channel 1, channel 2 . . . channel N, where N can be as great as 16 or even greater), as will be described further below in one specific embodiment. Each analog input signal 10, 12, 14 has an analog input signal value. This system converts each analog input signal value to an ultimate digital input value 24. This system has an input converter 4 for converting each analog input signal to a digital input signal 22 having a digital input value 22. The digital input value 22 directly corresponds to the analog input signal value 10, 12, 14. The first system also has a conveying means 6 for conveying the analog input signal value 10, 12, 14 as an ultimate digital input value 24 without performing any additional conversion above and beyond that which is performed by the input converter 4. One form of the conveying means 6 can be a microprocessor 6 having software which does not perform any additional conversion to the analog input signal value 20 beyond the conversion performed by the input converter 4.

In the embodiment shown in FIG. 3, the plurality of analog input signals 10, 12, 14 each have a predetermined input range of input signal values. This predetermined input range of input signal values can be a 4 to 20 mA signal from a standard 4 to 20 mA analog input device. To allow for the conversion of signals from multiple analog input devices, this system further includes an input multiplexor 2. The input multiplexor receives the plurality of analog input signals 10, 12, 14, and converts each 4 to 20 mA analog input signal 10, 12, 14 to a 1 to 5 Volt signal (see element 20) to be used by the input converter 4. In the present embodiment of the invention, this conversion is performed using ohms law, and placing a 250 ohm resistor between the two connections. Thus, a 4 mA signal will result in a 1.000 V signal, and a 20 mA signal will result in a 5.000 V signal. The resultant voltage signal is measured across the resistor in the present embodiment.

This 1 to 5 Volt signal is useable by the input converter 4. One predetermined input range of the input converter is 1 to 5 Volts. The input converter 4 in FIG. 3 (an analog to digital converter) converts the 1 to Volt signal 20 into a digital value 22 of 4000 to 20,000, for a 4 to 20 mA analog input signal value 10, 12, 14. The ultimate digital input value 24 is preferably within an accepted industrial standard range. The ultimate digital input values 24 for the embodiment shown in FIG. 3 is within a range from 0 to 32,000. Specifically, for the embodiment shown in FIG. 3, the range is from 4000 to 20,000, with a low value of 4000 and a high value of 20,000. One feature of the present invention is that the ultimate digital input value 24 is the same value as the analog input signal value 10, 12, 14. For example, the 4–20 mA analog signal equates to a 4000–20000 digital signal.

With reference to FIG. 4, a second system is provided having a plurality of analog output signals 40, 42, 44, which are provided to a plurality of analog output devices (not shown). These signals are shown as channels (channel 1, channel 2 . . . channel N, where N can be as great as 16 or even greater), as will be described further below in one specific embodiment. Each analog output signal 40, 42, 44 has an analog output signal value. Each analog output signal value is converted from an initial digital output signal value 30. The second system has a receiving and conveying means 6, shown as a microprocessor 6 in FIG. 4, for receiving the initial digital output signal value 30, and for conveying the initial digital output signal value 30 as a conveyed digital output signal value 32, without performing any conversion.

The second system also has an output converter 5, shown as a digital to analog converter 5 in FIG. 4, for converting the conveyed digital output signal value 32 into the analog output signal value 40, 42, 44. The analog output signal value 40, 42, 44 directly corresponds to the conveyed digital output signal value 32 and to the initial digital output signal value 30. In the embodiment in FIG. 4, the conveyed digital output signal value 32 and to the initial digital output signal value 30 are the same. Thus, in the embodiment in FIG. 4, the microprocessor 6 runs software which does not perform any conversion to the initial digital output signal value 30.

The plurality of analog output signals 40, 42, 44 each have a predetermined output range of output signal values. This range is 4 to 20 mA in the embodiment in FIG. 4. The FIG. 4 embodiment further includes an output multiplexor 3 for providing the plurality of analog output signals 40, 42, 44 (4 to 20 mA analog output signals in the FIG. 4 embodiment), converted from a 1 to 5 Volt signal (see element 34) received from the output converter 5. One predetermined output range of the output converter 5 is 1 to 5 Volts.

The initial digital output signal value 30 is preferably within an accepted industrial standard range, such as 0 to 32000, and more particularly within a range from 4000 to 20,000 for a 4 to 20 mA analog output signal 40, 42, 44. Thus, the initial digital output signal value preferably has a low value of 4000 and a high value of 20,000 for a 4 to 20 mA analog output signal 40, 42, 44.

The various different forms of the present invention can be used as an easy troubleshooting tool by systems engineers and others. One specific form of the present invention is a TSX Quantum Automation Series 140 ACI 040 00 (the "Input Converter"), implemented by the Assignee of the present invention. The Input Converter is a 16-channel analog current input module. The Input Converter was designed to provide high performance for process automation. The Input Converter interfaces with sixteen analog inputs. The module is software configurable on a per channel basis to either 4–20mA (0 to 16,000 counts Default), 4–20mA (0 to 4095 counts), 0–20mA (0 to 20,000 counts) and 0–25mA (0 to 25,000 counts).

The specific features of the Input Converter are as follows:
1. 16 differential (30 VDC Isolated) or 16 externally tied single ended input channels in a single module
2. High accuracy analog to digital conversion
3. No user adjustments
4. 15 bit resolution with an optional 12 bit mode for backward compatibility
5. Broken wire detect on each channel in 4–20 mA mode
6. All module power is provided by standard power supplies.
7. All programming and configuration follow all of the same look and feel rules as all other I/O modules in the TSX Quantum Automation Series
8. There can be any mix of I/O type mounted in the backplane
9. Quantum modules can be mounted in Class I Div. II areas minimizing wiring runs.

At 15 bit resolution the Input Converter provides tools to help make troubleshooting easy. A user no longer needs to guess about what you see in counts in terms what is being obtained in mA input. For instance in 0–25 mA mode a value of 2200 equates to 2.2 mA input.

The Input Converter's specifications are as follows:

Electrical Specifications

| | |
|---|---|
| Number of Input Points | 16 Analog |
| Required Addressing | 17 Words |
| Input Impedance | 250 ohms Nominal |
| Resolution | 4.0 to 20.0 mA (0–4095 counts) |
| (Default) | 4.0 to 20.0 mA (0–16000 counts) |
| | 0.0 to 20.0 mA (0–20000 counts) |
| | 0.0 to 25.0 mA (0–25000 counts) |
| Accuracy Error 25° C. | +/−0.1% of full scale |
| Linearity | +/−16 uA |
| Accuracy Drift W/Temperature | Typical: 0.0050% of Full Scale/° C. |
| | Maximum: 0.0075% of Full Scale/° C. |
| Isolation | |
| Channel to Channel | 30 V |
| Channel to Bus | 1780 Vac for 1 min. |
| Update time | 15 mS all channels |
| Input Filter | Single pole low pass, −3 dB cutoff @ 34 Hz, +−25% |
| Common Mode Rejection | >−90 dB @ 60 Hz |
| Fault Detection | Open loop in 4–20 mA range |
| Bus Current Required | 360 mA |
| Power Dissipation | 6.0 Watts |
| External Power Required | None |
| Fusing | |
| Internal | None |
| External | None |
| Absolute Maximum Input | 30 mA |
| Mechanical and Environmental Specifications | |
| Storage Temperature | −40° C. to +85° C. |
| Operating Temperature | 0° C. to 60° C. |
| Humidity (Non-Operating) | 95% Rh at 60° C., Non-Condensing, 96 Hours |
| (Operating) | 95% Rh at 60° C., Non-Condensing, 24 Hours |
| Altitude (Non-Operating) | Up to 15,000 ft. (4500 m) |
| (Operating) | Up to 6666 ft. (2000 m) |
| Vibration (Operating) | 10–57 Hz: 0.075 mmDA |
| | 57–150 Hz: 1 g |
| Shock (Non-Operating) | Up to 15 g, 11 mS, 3 shocks/axis |
| Free Fall (unpacked) | 1 m |

The Input Converter is approved as FM Class 1, Div. 2, UL 508 Specifications, CSA 22.2 -142, Protective Earth Continuity (IEC 1131), CE Marking. The Input Converter runs Concept version 2.2 or higher and Modsoft version 2.6 or higher software.

Other specifications for the Input Converter are as follows:

The User Interface

The high density analog output module has 2 Led's, (green, red). The green active Led shows data communication with the Quantum Master. The red fault Led is on if any channel detects a broken wire. The Panel Interface information is used to traffic cop and down load parameters to this module.

The Module traffic cop information is as follows:
This module has an ID number of 6Hex, Seventeen 3x Registers 0.4x registers.

The following tables are a list of parameters for the Quantum traffic cop:

| Field 1 | Field 2 | Field 3 | Field 4 | Field 5 |
|---|---|---|---|---|
| NAME | reserved | Not full drop | 3X registers | 4x registers |
| ACI 140 00 | N/A | 0 | 17 | 0 |

| Field 6 | Field 7 | Field 8 | Field 9 | Field 10 |
|---|---|---|---|---|
| Description AN 16CH CURR | Analog 1 | Module ID# LO126 | PDM 2 | 984 0008 |

| Field 11 | Parameter 1 | | | |
|---|---|---|---|---|
| Parameters 5 | default setting 0000 | | | |

Configuration of the Input Converter is as follows:

The configuration parameters for this module are down loaded from the PLC to the module's Dual Ported RAM.

Below is a description of the 5 parameter words:

| | | | |
|---|---|---|---|
| Word 1 | System Info | Field A | bit 0–14 not used |
| | | | bit 15 No shutdown state |
| | | Field B | N/A |
| | | Field C | N/A |
| Word 2 | channel range | Field D | |
| | | | bits 00–03 channel 1 count range |
| | | | bits 04–07 channel 2 count range |
| | | | bits 08–11 channel 3 count range |
| | | | bits 12–15 channel 4 count range |
| Word 3 | channel range | Field D | |
| | | | bits 00–03 channel 5 count range |
| | | | bits 04–07 channel 6 count range |
| | | | bits 08–11 channel 7 count range |
| | | | bits 12–15 channel 8 count range |
| Word 4 | channel range | Field D | |
| | | | bits 00–03 channel 9 count range |
| | | | bits 04–07 channel 10 count range |
| | | | bits 08–11 channel 11 count range |
| | | | bits 12–15 channel 12 count range |
| Word 5 | channel range | Field D | |
| | | | bits 00–03 channel 13 count range |
| | | | bits 04–07 channel 14 count range |
| | | | bits 08–11 channel 15 count range |
| | | | bits 12–15 channel 16 count range |

For WORD 1:
This word specifies if user shutdown values are expected:

| Word 1 | user shutdown values | Description |
|---|---|---|
| bit 0–14 | N/A | Not used |
| bit 15 | 0 | No outputs = No shutdown values |

For WORDs 2–5:
Words 2 to 5 each contain four 4-bit fields which define the acceptance input channel ranges for all sixteen channels. The only values that have been defined are as follows:

| 4 bit value | current range | Count range |
|---|---|---|
| 0101 | 4 to 20 MA. | 0 to 4095 counts (12-bit mode) |
| 0000 | 4 to 20 MA. | 0 to 16,000 counts (default) |
| 1010 | 0 to 20 MA. | 0 to 20,000 counts |
| 1111 | 0 to 25 MA. | 0 to 25,000 counts |

The Input Converter functionality:

The Input Converter updates 16 channels of input data in less than 10 msec. This module also reports broken wire status, displays correct information on module Led's, keeps hardware watchdog active, monitors and updates any down loaded parameters, and executes self diagnostics.

The TSX can utilize the following hardware:

A 16 MHz 87C54 microprocessor is used as the main processor. One analog to digital device (AD) is used for all 16 channels. The sequence of input data collecting can not be disrupted once it has started. Input data is collected in sequence from channel 1 to 16, by a 573 usec timed loop. The Dual Port Memory input data buffer will be updated after all 16 channels are processed. If a new parameter message is received all the input channels will be updated in the Dual Port Memory input data buffer after two scans of all the input channels (20 msec.). If the hardware watch dog times out, the asic chip will be reset and the module goes unhealthy. The hardware watch dog will time out if the firmware does not access the watch dog register within 1.6 sec. Status for broken wire is handled and reported by Firmware and hardware. See LMS bus Interface layer 2 spec. 043506414 for details. The following table shows the module broken wire hardware ASIC status information:

| Bit field | Meaning of bit | Analog channel # |
|---|---|---|
| bit 0 | good wire/broken wire (0/1) | Any channel |

Firmware in the Input Converter:

The code can be in INTEL 8051 assembly language. The executable image of this software would reside in the 87C54 internal prom.

Power Up Initialization of the Input Converter:

At power up, the following would take place:

Clear Dual Ported RAM (DPR).

Reset AID converter.

Initialize all data storage.

Down load the module's configuration from the PLC via PDR.

Do all confidence tests once.

Dual Ported RAM Interface in the Input Converter:

The input data can be collected by the Quantum bus Master. The input data would then be supplied at the end of the module's forever loop.

Run Time Confidence Tests in the Input Converter:

Certain tests are performed during run time:

Test on chip RAM.

Test on chip PROM.

Repeating program (forever loop) which can be used in the Input Converter:

repeat forever
    execute A/D converter interface, collect input data
    process input analog data
    supply new input data
    update Led's and broken wire status
    kick watch dog
    if message present
        handle and process message
    else
        execute run time confidence tests Some program specifications can include:

1. Analog input data processing can be done every 573/ usec.
2. All other firmware task can execute when analog data processing is not in process.

Analog Input Data Processing:

The writing of input data can be done in a controlled loop, because the hardware Cs5102 device requires wait loops. Other Firmware tasks may be needed within these hardware wait loops. These wait loops and tasks are described in the following table:

| | Hardware wait loop time | task within wait loop | function |
|---|---|---|---|
| Step 1 | 500/ usec. | | Precharge mux delay |
| Step 1A | | 2 usec. | Set precharge mux and group reference switch |
| Step 1B | | 12 usec. | Read input data |
| Step 2 | 5 usec. | | Disable all mux's and wait 4 usec. |
| Step 3 | 2 usec. | | Set address sampling mux |
| Step 4 | 20 usec. | | Wait loop |
| Step 5 | 41 usec. | | Wait for Cs5102 to signal convertion complete |
| Step 5A | | 4 usec. | Hold start conversion 4 usec. pulse |
| Step 6 | 5 usec. | | Disable all mux's and wait 4 usec. |
| | Total 573 | | |

An algorithm ay be needed for the 4 to 20 mA. 12-bit range. When this range is selected the firmware will use a lookup table to translate the input count range (8,000 to 40,000) to a range count (0 to 4095).

Registers in the Input Converter:

Seventeen 3X registers can be used for input data and status as shown in the following table:

| | |
|---|---|
| 3X register 1 | Channel 1 input data |
| 3X register 2 | Channel 2 input data |
| 3X register 3 | Channel 3 input data |
| 3X register 4 | Channel 4 input data |
| 3X register 5 | Channel 5 input data |
| 3X register 6 | Channel 6 input data |
| 3X register 7 | Channel 7 input data |
| 3X register 8 | Channel 8 input data |
| 3X register 9 | Channel 9 input data |
| 3X register 10 | Channel 10 input data |
| 3X register 11 | Channel 11 input data |
| 3X register 12 | Channel 12 input data |
| 3X register 13 | Channel 13 input data |
| 3X register 14 | Channel 14 input data |
| 3X register 15 | Channel 15 input data |
| 3X register 16 | Channel 16 input data |
| 3X register 17 | Broken wire status |

The following table shows the bit assignments for broken wire status:

| Bit field | Meaning of bit | Analog channel # |
|---|---|---|
| bit 0 | good wire/broken wire (0/1) | 1 |
| bit 1 | good wire/broken wire (0/1) | 2 |
| bit 2 | good wire/broken wire (0/1) | 3 |
| bit 3 | good wire/broken wire (0/1) | 4 |
| bit 4 | good wire/broken wire (0/1) | 5 |
| bit 5 | good wire/broken wire (0/1) | 6 |
| bit 6 | good wire/broken wire (0/1) | 7 |
| bit 7 | good wire/broken wire (0/1) | 8 |
| bit 8 | good wire/broken wire (0/1) | 9 |
| bit 9 | good wire/broken wire (0/1) | 10 |
| bit 10 | good wire/broken wire (0/1) | 11 |
| bit 11 | good wire/broken wire (0/1) | 12 |
| bit 12 | good wire/broken wire (0/1) | 13 |
| bit 13 | good wire/broken wire (0/1) | 14 |
| bit 13 | good wire/broken wire (0/1) | 15 |
| bit 15 | good wire/broken wire (0/1) | 16 |

Another specific embodiment of the present invention is a TSX Quantum Automation Series 140 ACO 130 00 8—Channel High Density Analog Current Output Module (the "Output Converter"). The Output Converter interfaces with eight analog outputs. The Output Converter is software configurable on a per channel basis to either 4–20 mA (0 to 16,000 counts default), 4–20 mA (0 to 4095 counts), 0–20 mA (0 to 20,000 counts) and 0–25 mA (0 to 25,000 counts). The Output Converter is compatible with several standard power supplies.

The Output Converter has the following features:
1. 8 single ended input channels in a single module
2. High accuracy digital to analog conversion
3. 15 bit resolution with an optional 12 bit mode for backward compatibility
4. 5 mS update for all eight channels
5. Each channel can be configured to go to 0, the last value, or a user defined value upon loss of communications with the control element.
6. Broken wire detect on each channel in 4–20 mA mode
7. All module power is provided by standard TSX Quantum backplane power supplies.
8. All programming and configuration follow all of the same look and feel rules as all other I/O modules in the TSX Quantum Automation Series
9. There can be any mix of I/O type mounted in the backplane
10. Quantum modules can be mounted in Class I Div. II areas minimizing wiring runs.

At 15 bit resolution the Output Converter makes trouble shooting much easier. Specifically, a user of the system no longer needs to guess what the digital value equates to in terms of mA. For instance in 0–25 mA mode a value of 22 equates to 2.2 mA output. This coupled with corresponding field terminal strip monitor points which when read with a DVM reflect 0.1 VDC to 1 mA output.

The Output Converter has the following specifications:

Electrical Specifications

| | |
|---|---|
| Number of Output Channels | 8 |
| Required Addressing | 8 Words |
| Logo Voltage | 6 to 30 VDC |
| Resolution | 4.0 to 20.0 mA (0–4095 counts) 12 bits |
| | 4.0 to 20.0 mA (0–16000 counts, default) 15 Bits |
| | 0.0 to 20.0 mA (0–20000 counts) 15 Bits |
| | 0.0 to 25.0 mA (0–25000 counts) 15 Bits |
| Accuracy Error @ 25° C. | +/−0.2% of full scale |
| Linearity | +/−12 uA, 4.0 to 20. mA (0–4095 counts) |
| | +/−4 uA, 4.0 to 20. mA (0–16000 counts) |
| | +/−4 uA, 0.0 to 20. mA (0–20000 counts) |
| | +/−4 uA, 0.0 to 25. mA (0–25000 counts) |
| Monotonic Output | Yes |
| Accuracy Drift W/Temperature | Typical: 0.006% of Full Scale/° C. Maximum: 0.009% of Full Scale/° C. |

Isolation

| | |
|---|---|
| Channel to Channel | 0 V |
| Channel to Bus | 1780 Vac for 1 min. |
| Update time | 5 mS all channels |
| Setting Time for Full Scale | 1.6 mS to 5% of the final value |
| Step Change | 3.2 mS to 0.1% of final value |
| Fault Detection | Open loop in 4–20 mA range |
| Bus Current Required | 550 mA |
| Power Dissipation | 5.0 Watts |
| External Power Required | See Loop Voltage Above |

Fusing

| | |
|---|---|
| Internal | None |
| External | None |

Voltmeter Monitor Specifications

| | |
|---|---|
| Accuracy | +/−0.2% of Full Scale |
| Scaling | $V_{out}(Volts) = 1_{ILOOP\ (mA)} \times 0.10$ |
| Output Imperdance | 300 ohm |
| Wire Length | 1 m max. |

Mechanical and Environmental Specifications

| | |
|---|---|
| Storage Temperature | −40° C. to +85° C. |
| Operating Temperature | 0° C. to 60° C. |
| Humidity (Non-Operating) | 95% Rh at 60° C., Non-Condensing, 96 Hours |
| (Operating) | 95% Rh at 60° C., Non-Condensing, 24 Hours |
| Altitude (Non-Operating) | Up to 15,000 ft. (4500 m) |
| (Operating) | Up to 6666 ft. (2000 m) |
| Vibration (Operating) | 10–57 Hz: 0.075 mmDA 57–150 Hz: 1 g |
| Shock (Non-Operating) | Up to 15 g, 11 mS, 3 shocks/axis |
| Free Fall (unpacked) | 1 m |

The Output Converter is approved as FM Class 1, Div. 2, UL 508 Specifications, CSA 22.2-142, Protective Earth Continuity (IEC 1131), CE Marking. The Output Converter runs Concept version 2.2 or higher and Modsoft version 2.6 or higher software.

The following are additional specifications for the Output Converter:
The User Interface for the Output Converter:
The high density analog output module has 18 Led's, 2 Led's (green, red) for each of the eight channels, an active Led, and one fault Led. The green active Led shows data communication with the Quantum Master. The green Led's 1–8 are used to show that the respective 8 channel outputs are active, (green Led 1=channel 1, green Led 2=channel 2 etc.) Led on=channel is active. Note: channels are not handled as individuals, they are all on or off. The red Led's 1–8 are used to show that the respective 8 channel outputs ha broken wire. (red Led 1=channel 1, red Led 2=channel 2 etc.) Led on=broken wire. The red fault Led is on if any channel detects a broken wire.

Information on the Panel Interface of the Output Converter is used to traffic cop and down load parameters to this module. This module has an ID number of 125Hex, Zero 3x register, Eight 4x registers. The following tables are a list of parameters for the Quantum traffic cop:

| Field 1 | Field 2 | Field 3 | Field 4 | Field 5 |
|---|---|---|---|---|
| NAME Aco 130 00 | reserved N/A | Not full drop 0 | 3X registers 0 | 4x registers 8 (output) |

| Field 6 | Field 7 | Field 8 | Field 9 | Field 10 |
|---|---|---|---|---|
| Description AN OUT 8CH CURR | Analog 1 | Module ID# L0125 | DPM 2 | 984 0008 |

| Field 11 | Parameter 1 | Parameter 2 | Parameter 3–11 |
|---|---|---|---|
| Parameters 11 | default setting 8000 | default setting 5555 | default setting 0000 |

The Output Converter can be configured as follows:
  The configuration parameters for this module are down loaded from the PLC to the module's Dual Ported RAM.
Below is a description of the 11 parameter words:

| Word 1 | System info. | Field A | bit 0–14 not used bit 15 output shutdown state |
|---|---|---|---|
| Word 2 | Fail states | Field B | bit 0–1 channel 1 fail state bit 2–3 channel 2 fail state bit 4–5 channel 3 fail state bit 6–7 channel 4 fail state bit 8–9 channel 5 fail state bit 10–11 channel 6 fail state bit 12–13 channel 7 fail state bit 14–15 channel 8 fail state |
| Word 3 | Output state | Field C | 0 to 8 channels of user defined shutdown values |
| Word 3 + x | channel range | Field D | |
| | | | bits 00–03 channel 1 count range bits 04–07 channel 2 count range bits 08–11 channel 3 count range bits 12–15 channel 4 count range |
| Word 4 + x | channel range | Field D | |
| | | | bits 00–03 channel 5 count range bits 04–07 channel 6 count range bits 08–11 channel 7 count range bits 12–15 channel 8 count range |

For WORD 1:
This word specifies if user shutdown values are excepted:

| Word 1 | user shutdown values | Description |
|---|---|---|
| bit 0–14 | N/A | Not used |
| bit 15 | 0/1 | No channels with user defined shutdown values/some channels have user defined |

| Word 1 | user shutdown values | Description |
|---|---|---|
| | | shutdown values |

For WORD 2:
This word contains eight 2-bit fields which define the fail state for each channel.
The four possible values of fail state are as follows:

| 2 bit value | Fail State |
|---|---|
| 00 | minimum output current (default) |
| 01 | Hold last value |
| 10 | user defined shutdown value |
| 11 | Hold last value |

For WORD 3:
Word 3 starts a block of words that define any required user shutdown values. If there are no channels with user defined shutdown values ([word 1, bit 15=0] or [all channels in word 2=hold last value]), then this block does not exist and the channel range words become words 3 and 4.
  Each shutdown value in this block corresponds to a channel(s) in word 2 which requires a user defined shutdown value. The order in which each shutdown value appears in this block corresponds exactly with the order in which user defined shutdown values are required in word 2. Note: If a user shutdown value is greater than the count range for that particular channel, then the count range maximum value will be used as the shutdown value. The number of words in this block is X, where X has a possible range of 0 to 8.
For WORD 3+X AND 4+X:
Word 3+X and 4+X each contain four 4-bit fields which define the acceptable output channel ranges for all eight channels. The only values that have been defined are as follows:

| 4 bit value | current range | Count range |
|---|---|---|
| 0101 | 4 to 20 MA. | 0 to 4095 counts (12-bit mode) |
| 0000 | 4 to 20 MA. | 0 to 16,000 counts (default) |
| 1010 | 0 to 20 MA. | 0 to 20,000 counts |
| 1111 | 0 to 25 MA. | 0 to 25,000 counts |

The Output Converter can update 8 channels of output data in less than 5 msec. This module also reports broken wire status, displays correct information on module Led's, keeps hardware watchdog active, monitors and updates any down loadable parameters, and executes self diagnostics.
The Output Converter can use the following hardware:
  A 16 MHz 87C54 microprocessor can be used as the main processor. One digital to analog device (D/A) can be used for all 8 channels. The sequence of sending output data should not be disrupted once it has started. Output data can be sent in sequence from channel 1 to 8, by a 178 usec. timed loop. The Dual Port Memory output data buffer should be read before all 8 chnnels are processed. If a new parameter message is received, then output channels will be updated as each channel is processed. (maximum two scans 10 msec.). If the hardware watch dog times out, the asic chip will be reset and all outputs will go to 0 current. The hardware watch dog will time out if the firmware does not access the watch dog register within 1.6 sec. Status for broken wire is handled and reported by the hardware via. the ASIC register. This table shows the Output Converter broken wire status information:

| Bit field | Meaning of bit | Analog channel # |
|---|---|---|
| bit 0 | good wire/broken wire (0/1) | 1 |
| bit 1 | good wire/broken wire (0/1) | 2 |
| bit 2 | good wire/broken wire (0/1) | 3 |
| bit 3 | good wire/broken wire (0/1) | 4 |
| bit 4 | good wire/broken wire (0/1) | 5 |
| bit 5 | good wire/broken wire (0/1) | 6 |
| bit 6 | good wire/broken wire (0/1) | 7 |
| bit 7 | good wire/broken wire (0/1) | 8 |

The Output Converter can be coded in INTEL 8051 assembly language. The executable image of this software can reside in the 87C54 internal prom. Upon power up initialization the following should be performed:

Clear Dual Ported RAM (DPR).

Initialize all data storage.

Down load the module's configuration from the PLC via DPR.

Do all confidence tests once.

The Output Converter Dual Ported RAM Interface:

The output data can be supplied by a bus Master. The output data is collected at the beginning of the module's forever loop.

The following repeating routine can be used in the Output Converter:

repeat forever
  collect new output data
  process output analog data
  execute D/A converter interface, send output data;
  update Led's and broken wire status
  kick watch dog
  if message present
    handle and process message
  else
    execute run time confidence tests The Output Converter run routine:

1. Analog output data processing can be done every 178 usec.
2. All other firmware task can executed when analog data processing is not in process.

The writing of output data can be done in a controlled loop, because the outputs should be written every 178 usec to maintain correct output levels.

This table describes the data flow for analog data processing:

| sequence | Time needed | function |
|---|---|---|
| Step 1 | 2 usec. | Disable mux |
| Step 2 | 12 usec. | Download output data to Ltc1595 DAC. |
| Step 3 | 2 usec. | Latch output data to Ltc1595 DAC. |
| Step 4 | 10 usec. | Wait for Ltc1595 DAC. data to settle |
| Step 5 | 2 usec. | Change mux address and enable |
|  | Total 28 usec. |  |
| Step 6 | 150 usec. | charge output cap. |

The Output Converter can use eight 4X registers for output data as shown in the following table:

| 4X register 1 | Data for output channel 1 |
|---|---|
| 4X register 2 | Data for output channel 2 |
| 4X register 3 | Data for output channel 3 |
| 4X register 4 | Data for output channei 4 |
| 4X register 5 | Data for output channel 5 |
| 4X register 6 | Data for output channel 6 |
| 4X register 7 | Data for output channel 7 |
| 4X register 8 | Data for output channel 8 |

While the specific embodiments have been illustrated and described, numerous modifications come to mind without significantly departing from the spirit of the invention and the scope of protection is only limited by the scope of the accompanying Claims.

We claim:

1. A system, having a plurality of analog input signals for a plurality of analog input devices, each analog input signal having an analog input signal value, the system converting each analog input signal value to an ultimate digital input value, comprising:

an input converter for converting each analog input signal to a digital input signal having a digital input value, wherein the digital input value directly corresponds to the analog input signal value; and, means for conveying the digital input value as an ultimate digital input value without performing any additional conversion to the digital input value within the means for conveying, wherein the ultimate digital input value can be directly used to interpret each analog input signal value.

2. The system of claim 1 wherein the means for conveying the analog input signal value as an ultimate digital input value does not perform any additional conversion.

3. The system of claim 1 wherein the plurality of analog input signals each have a predetermined input range of input signal values.

4. The system of claim 2 wherein the predetermined input range of input signal values is 4 to 20 mA.

5. The system of claim 4 further comprising:

an input multiplexor receiving the plurality of analog input signals, and for converting the 4 to 20 mA analog input signals to a 1 to 5 Volt signal to be used by the input converter.

6. The system of claim 1 further comprising:

an input multiplexor for receiving the plurality of analog input signals, and for converting each analog input signal to a useable signal, wherein the useable input signal is provided to the input converter.

7. The system of claim 1 wherein a predetermined input range of the input converter is 1 to 5 Volts.

8. The system of claim 1 wherein the ultimate digital input value is within an accepted industrial standard range.

9. The system of claim 1 wherein the ultimate digital input value is within a range from 0 to 32,000.

10. The system of claim 1 wherein the ultimate digital input value is within a range from 4000 to 20,000.

11. The system of claim 9 wherein the ultimate digital input value has a low value of 4000 and a high value of 20,000.

12. The system of claim 1, wherein the means for conveying the analog input signal value as an ultimate digital input value is a microprocessor having software which does not perform any additional conversion to the analog input signal value.

13. The system of claim 1 wherein the ultimate digital input value is the same value as the analog input signal value.

14. A system, having a plurality of analog output signals for a plurality of analog output devices, each analog output signal having an analog output signal value, and each analog output signal value being converted from an initial digital output signal value, comprising:

means for receiving the initial digital output signal value, and for conveying the initial digital output signal value as a conveyed digital output signal without performing any conversion to the to the initial digital output value within the means for conveying; and, an output converter for converting the conveyed digital output signal value into the analog output signal value, wherein the analog output signal value directly corresponds to the initial digital output signal value, wherein the initial digital output value can be directly used to interpret each analog output signal value.

15. The system of claim 14 wherein the receiving and conveying mean does not perform any conversion.

16. The system of claim 14 wherein the plurality of analog output signals each have a predetermined output range of output signal values.

17. The system of claim 16 wherein the predetermined output range of output signal values is 4 to 20 mA.

18. The system of claim 17 further comprising:

an output multiplexor for providing a plurality of analog output signals, and for converting the 4 to 20 mA analog output signals from a 1 to 5 Volt signal received from the output converter.

19. The system of claim 14 wherein a predetermined output range of the output converter is 1 to 5 Volts.

20. The system of claim 14 wherein the initial digital output signal value is within an accepted industrial standard range.

21. The system of claim 14 wherein the initial digital output signal value is within a range from 0 to 32,000.

22. The system of claim 14 wherein the initial digital output signal value is within a range from 4000 to 20,000.

23. The system of claim 21 wherein the initial digital output signal value has a low value of 4000 and a high value of 20,000.

24. The system of claim 14 wherein the means for receiving and conveying is a microprocessor having software which does not perform any conversion to the initial digital output signal value.

25. The system of claim 14 wherein a conveyed digital output signal value is conveyed by the receiving and conveying means, and wherein the conveyed digital output signal value is the same as the initial digital output signal value.

* * * * *